(12) United States Patent
Willemsen et al.

(10) Patent No.: US 11,296,395 B2
(45) Date of Patent: Apr. 5, 2022

(54) KIT OF PARTS, MODULAR HOUSING, STREET POLE AND MOUNTING METHOD

(71) Applicant: SIGNIFY HOLDING B.V., Eindhoven (NL)

(72) Inventors: Oscar Hendrikus Willemsen, Eindhoven (NL); Mathew Lee Bembridge, Eindhoven (NL); Vincent Johannes Jacobus Van Montfort, Eindhoven (NL); Petra Bijl, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 214 days.

(21) Appl. No.: 16/620,583

(22) PCT Filed: Jun. 5, 2018

(86) PCT No.: PCT/EP2018/064743
§ 371 (c)(1),
(2) Date: Dec. 9, 2019

(87) PCT Pub. No.: WO2018/224484
PCT Pub. Date: Dec. 13, 2018

(65) Prior Publication Data
US 2020/0185811 A1 Jun. 11, 2020

(30) Foreign Application Priority Data
Jun. 9, 2017 (EP) ..................................... 17175139

(51) Int. Cl.
*H05K 5/02* (2006.01)
*H01Q 1/12* (2006.01)
(Continued)

(52) U.S. Cl.
CPC ......... *H01Q 1/1228* (2013.01); *H01Q 1/2291* (2013.01); *H01Q 1/44* (2013.01);
(Continued)

(58) Field of Classification Search
CPC .................................................... H05K 5/0204
See application file for complete search history.

(56) References Cited

U.S. PATENT DOCUMENTS 6,229,948 B1 * 5/2001 Blee ....................... G02B 6/483
385/134
6,486,399 B1 11/2002 Armstrong et al.
(Continued)

FOREIGN PATENT DOCUMENTS

GB 2410378 A 7/2005

*Primary Examiner* — Hung V Ngo (57) ABSTRACT

The invention relates to a kit of parts attachable to a substrate, said kit of parts having an elongated, electric conductive bracket extending along an axis and attachable to the substrate in an electrically grounded connection thereto. The kit of part further includes a modular housing having a base mountable onto the bracket, a cover mounted onto the base, the cover and the base enclosing a chamber, and a plate-shaped, axially extending, elongated electric conductive carrier provided inside the chamber and in electrically grounded connection to the bracket. The invention further relates to a modular housing suitable for use in the kit of parts, a street pole having said kit of parts, and a method for mounting a modular housing.

14 Claims, 6 Drawing Sheets

(51) Int. Cl.
*H01Q 1/22* (2006.01)
*H01Q 1/44* (2006.01)
*H05K 5/03* (2006.01)

(52) U.S. Cl.
CPC ......... *H05K 5/0204* (2013.01); *H05K 5/0247* (2013.01); *H05K 5/03* (2013.01)

(56) References Cited

U.S. PATENT DOCUMENTS

| | | | |
|---|---|---|---|
| 6,974,908 B2* | 12/2005 | White | H02G 3/32 174/50 |
| 7,703,996 B1* | 4/2010 | Sexton, Jr. | G08B 13/19632 396/427 |
| 7,789,360 B2* | 9/2010 | Qualy | G09F 15/0037 248/218.4 |
| 9,810,369 B2* | 11/2017 | Lilieholm | H01Q 1/1207 |
| 10,103,421 B1* | 10/2018 | Alexander | H01Q 1/12 |
| 10,490,991 B2* | 11/2019 | Ritosa | H01R 4/42 |
| 2004/0035602 A1 | 2/2004 | White | |
| 2008/0239632 A1* | 10/2008 | Wayman | H05K 5/0204 361/600 |
| 2009/0231828 A1* | 9/2009 | Madore | H05K 5/0204 361/825 |
| 2009/0273261 A1 | 11/2009 | Fournier et al. | |
| 2016/0131358 A1 | 5/2016 | Spiro | |
| 2019/0341674 A1* | 11/2019 | Rosenthal | H01Q 1/246 |

\* cited by examiner

KIT OF PARTS, MODULAR HOUSING, STREET POLE AND MOUNTING METHOD

CROSS-REFERENCE TO PRIOR APPLICATIONS

This application is the U.S. National Phase application under 35 U.S.C. § 371 of International Application No. PCT/EP2018/064743, filed on Jun. 5, 2018, which claims the benefit of European Patent Application No. 17175139.9, filed on Jun. 9, 2017. These applications are hereby incorporated by reference herein.

FIELD OF THE INVENTION

The invention relates to a kit of parts comprising a bracket and a modular housing. The invention further relates to a modular housing suitable for use in the kit of parts, a street pole comprising said kit of parts, and a method for mounting a modular housing.

BACKGROUND OF THE INVENTION

Nowadays street poles dot our modern landscape, for example from city parks to parking lots and from pedestrian walkways to commuter roadways. Some of these street poles are also illumination poles or street light poles. Illumination or street light poles serve to illuminate their respective surroundings to provide visibility in darkly lit environments and/or during the night hours when there is a natural absence of light. By supplying visibility in environments otherwise low on light, these illumination poles provide value to a community through an added measure of safety, security, and convenience. But with the advent of the technological revolution, including advances in power generation, power distribution, and power and data connectivity as well as a variety of electronic devices having increasingly better processing capabilities and connectivity, municipalities are beginning to use these advances to transform their respective landscapes into "smarter" landscapes. For example, conventional traffic lights and conventional (illumination) poles, and their accompanying structure, are becoming increasingly populated with additional lighting and non-lighting related devices that improve the lights' and poles' collective utility to the community. Usually these additional devices are accommodated in housings/boxes which are mounted onto the pole, either at the top, at their side and/or at their base. A street pole provided with such an additional, boxed device is for example known from US20160131358A1.

The additional devices comprise, for example, cameras to monitor traffic flow, photocells to automate the activation of light from the luminaire in low-light conditions, or telecommunication network devices. However, this transformation of the traffic light or the illumination pole to include additional lighting and/or non-lighting related devices is not without disadvantages. For example, adding, removing, or somehow altering components of the (illumination) pole may compromise the structural integrity of the pole itself and often mounting of the housing/box involves relatively complex, laborious, expensive work and maintenance. Changes and/or additions to the pole may not only diminish the aesthetic architectural appeal originally intended by the designer but also degrade the uniformity and beauty of the poles chosen by the municipality. Mounting after-market cameras and/or additional products to a pole may diminish the original aesthetic appeal by creating unsightly structural configurations and wiring and by introducing unpleasant disparity between poles. One other aspect of hosting for telecommunication is that the lifecycle of the equipment is much shorter than what is used to in street lighting infrastructure. For instance, the lifetime of LED luminaires can span more than ten years, whereas the street pole itself can easily last for thirty years. In contrast to this, a new Wi-Fi standard is released every one to two years causing the equipment to be soon outdated after typically five years, after which it needs to be replaced. Hence, there is a strong need for making the installation and de-installation of equipment as easy as possible, minimizing installation cost and time.

SUMMARY OF THE INVENTION

It is an object of the invention to counteract and/or obviate at least one of the disadvantages associated with the known devices that are suitable to be added to the street poles. Thereto the invention provides a kit of parts attachable to a substrate, said kit of parts comprising:
- an elongated, electric conductive bracket extending along an axis and attachable to the substrate in an electrically grounded connection thereto, and
- a modular housing comprising:
  - a base mountable onto the bracket;
  - a cover mounted onto the base, the cover and the base enclosing a chamber; and
  - a plate-shaped, axially extending, elongated electric conductive carrier provided inside the chamber and in electrically grounded connection to the bracket.

By the housing being built-up in a modular way, parts of it, for example the cover, can be easily chosen such as being adapted in appearance, for example having an outer shape and/or surface texture and/or color, that it matches with the shape, color and/or surface structure of the substrate onto said modular housing is mounted. Thus, rendering the modular housing being more aesthetically appealing and relatively unobtrusive. Typically the bracket is mounted to the pole via tie-raps-like strips, then the bracket thereto has a pair of openings on either end of the elongated shape through which a respective strip can extend and further extend around the pole in a tight manner. However, despite the bracket being electrically conductive and/or has an electrically conductive surface, in the case the pole is painted with an electrically non-conducting paint, such mounting might not automatically render the bracket being grounded, i.e. connected to earth, via the pole. Thereto, alternatively the bracket may be mounted to the pole via screws or bolts engaging openings in both the bracket and the pole, the screws/bolts thus touch bare metal of the pole and thus ensure that the bracket upon mounting is simultaneously electrically grounded via the pole.

In other words, the modular housing comprises an assembly of at least two metal components, plus one or two plastic components. The first metal component, i.e. the bracket, is used to make a stable galvanic connection to the pole. The second metal component, i.e. the carrier, has been designed such that it simultaneously makes a defined and stable galvanic connection to the bracket at the moment it is mounted to the bracket. As both the bracket and the carrier upon fixation to the pole respectively to the bracket simultaneously make galvanic connection, separate connectors and/or handling for making the galvanic connection is avoided, thus simplifying the installation. This carrier can have several shapes the mount a variety of communication equipment and sensory equipment on. The carrier is such that said equipment can be pre-installed before it needs to be mounted to the bracket. The pre-installation includes a mechanical fixation of the one or more components and cabling in between, and it may include making a galvanic connection to the grounding parts of said equipment. Third, i.e. base, and potentially the fourth component, i.e. cover, together will create an enclosure, i.e. chamber, for the equipment, such that it is protected from dust and debris. This assembly has the advantage that it can easily be installed in a fashion that an installer of equipment in an outdoor environment is used to. Because the metal components are all galvanically connected to the street light pole after the mechanical installation, the equipment in the housing will also be. This has the advantage that the equipment can work without failure and it is also better surge protected. Furthermore the assembly has the advantage that the first metal component can remain on the pole in the case that equipment needs to be replaced or upgraded. The de-installation and installation can be done with a minimum of installation time and grounding is re-established upon every new installation.

The kit of parts may have the feature that in assembled configuration of the modular housing a respective set of a base mounting opening, a cover mounting opening and a carrier mounting opening are aligned for mutual fixation of the base, the cover and the carrier by a single fixing element (screw, bolt, rivet). Thus, installation is further simplified.

The kit of parts may have the feature that the modular housing comprises at least two sets, preferably four sets, evenly distributed at the base of the modular housing. Thus, a reliable and robust fixation of the housing to the bracket is attained, which in the case of a street pole is relevant as said fixation needs to be able to withstand the possible impact of a street vehicle, for example a car, that collides with the street pole.

The kit of parts may have the feature that the cover has a cover window which is closed by the base and wherein the cover tapers from the cover window to a cover end face opposite to said cover window. This has the advantage that the accumulation of water, debris and/or dust on the modular housing is reduced or that even dust and debris are removed from the housing in a natural way, for example via rain. Furthermore, this feature renders the modular housing to have a relatively slim appearance, thus rendering the modular housing to be relatively unobtrusive when installed compared to a rectangular boxed housing.

The kit of parts may have the feature that the carrier comprises:
- at a first carrier end a first carrier support strip comprising a hook for rotatable seating of the carrier in first bracket attachment means;
- at a second carrier end opposite to the first carrier end, a second carrier support strip comprising a carrier attachment opening, in assembled configuration said carrier attachment opening being aligned with second bracket attachment means;
- each support strips extending on both sides and in transverse direction from the plate-shaped carrier and from the axis.

The carrier is designed such that can be attached to the bracket with a rigid fixation and little installation time while establishing a galvanic connection between the bracket and the carrier. According to the most preferred embodiment, the carrier has a hook that hooks into the bracket, and locking of the bracket with the carrier is done, for example with a screw. Alternatively the bracket comprises the hook. Alternatively the fixation is done with a clamp. The abovementioned features and the mentioned alternatives have the advantage that installation of the modular housing is reliable and simplified.

The kit of parts may have the feature that each carrier support strip further comprises at respective opposite strip ends a respective carrier mounting opening, in assembled configuration said carrier mounting opening being aligned with a respective base mounting opening and cover mounting opening. The alignment is simultaneously attained upon hooking the carrier onto the bracket, thus simplifying the installation of the modular housing.

The kit of parts may have the feature that the base has an access opening allowing access of electric cabling from the substrate to electric equipment in the chamber, preferably said access opening is provided on an inner portion with a cable gland. The access opening enables easy access for electric cabling, for example power cabling or Ethernet cabling, from the inner space of the pole to the chamber of the modular housing. A cable gland provides protection to said cabling from being damaged by sharp edges that might be present in the access opening.

The kit of parts may have the feature that the bracket has a tapering protrusion as bracket connection means for an electrically grounded connection to the substrate via a press fit with an opening in the substrate. The bracket is mounted and dimensioned such that it overlaps the location of where a hole in the pole should be drilled to make a throughput of the cable that provides power and data to the equipment that is contained in the module. A provision, for example the tapering protrusion, has been made in the bracket that fits into the hole of the pole and is designed such that it upon mounting it simultaneously makes a galvanic connection to the pole. For instance the provision can be a conical protrusion that fits the hole and which makes galvanic connection to the inner surface of the hole. Thus, when tie wrapping the module to the pole, a stable galvanic connection is made.

The kit of parts may have the feature that said protrusion is hollow and allows access of electric cabling from the substrate via the base to electric equipment in the chamber. This is advantageous as by this single feature both easy access for electric cabling and galvanic connection of the bracket is attained.

The kit of parts may have the feature that the bracket has a transversely extending slot as first attachment means and an opening or snap fit feature as second attachment means. Typically the bracket is mounted in elongated direction along the length direction of a street pole positioned at the side of the road. The slot then extends in a horizontal direction and can be used for suspension of the base and/or carrier when these are provided with a hook insurable into the slot. Said combination of slot and hook can then function both as first attachment means, and as rotation means/axis of rotation of the base/carrier with respect to the bracket. Upon rotation another fixation feature of the base/carrier can be rotated to snap into second attachment means of the bracket and thus be mutually fixed/attached.

The kit of parts may have the feature that electric equipment is accommodated in the chamber and mounted onto the plate-shaped carrier. The chamber provides appropriate protection to the electric equipment against ambient atmosphere conditions like dust/debris and rain.

The kit of parts may have the feature that the cover is permeable for electromagnetic waves and wherein the electric equipment comprises a Wi-Fi device, preferably comprising an axially extending antenna and a transversely extending antenna, more preferably the axially extending antenna is positioned more remote from the base than the transversely extending antenna. When the cover is permeable for electromagnetic waves, the Wi-Fi device can be protected from direct view, thus reducing the risk on being damaged due to vandalism. Furthermore, the specified orientation and positions of the antennae results in better functioning of the Wi-Fi device.

The invention further relates to a modular housing suitable for use in a kit of parts according to the invention and to a street pole provided with a kit of parts according to the invention.

The invention further relates to a method for mounting a modular housing according to the invention, the method comprising the steps of:
  pre-mounting electric equipment on a plate-shaped, elongated, electric conductive carrier;
  mounting in an electrically grounded connection of an elongated, electric conductive bracket in an axial direction to a street pole along the length of the street pole;
  mounting a base onto the bracket;
  mounting of the plate-shaped, elongated carrier in axial direction onto the base, whereby the carrier is in electrically grounded connection with the bracket;
  mounting of a cover onto the base, thus forming a chamber in which the carrier with electric equipment is accommodated.

Typically a modular housing with bracket installable to a street light pole is provided, comprising:
  an elongated, electric conductive bracket extending along an axis and mountable to the substrate and electrically connected thereto, the bracket comprising:
    bracket mounting means, for example openings, either for mounting via strips or screws;
    bracket connecting means, for example and opening, optionally with hollow protrusion tapering away from mounting surface;
    first bracket attachment means (slot) and second bracket attachment means such as a screw or bolt opening and/or a click fit);
  a base mounted onto the attaching means of the bracket, the base comprising:
    a base access opening and at least one base mounting opening;
  a cover mounted onto the base, the cover having at least one cover mounting opening, and a cover window which is closed by the base, the cover tapers from the cover window to a cover end face opposite to said cover window, the cover and base enclosing a chamber;
  a plate-shaped, axially extending, elongated electric conductive carrier provided inside the chamber and electrically connected to the bracket, the carrier comprising:
    at a first carrier end a first carrier support strip comprising a hook for rotatable seating of the carrier in the first bracket attachment means;
    at a second carrier end opposite to the first carrier end, a second carrier support strip comprising a carrier attachment opening, in assembled configuration said carrier attachment opening being aligned with the second bracket attachment means;
    each support strips extending on both sides and in transverse direction from the plate-shaped carrier and from the axis, each carrier support strip further comprising at respective opposite strip ends a respective carrier mounting opening in assembled configuration said carrier mounting opening being aligned with a respective base mounting opening and cover mounting opening.

BRIEF DESCRIPTION OF THE DRAWINGS

The invention will now be further elucidated by means of the schematic and non-limiting drawings of preferred embodiments, in which:
FIGS. 7a-e shows various stages in the installation of the kit of parts onto a pole.

DETAILED DESCRIPTION OF THE EMBODIMENTS

Figure 1:
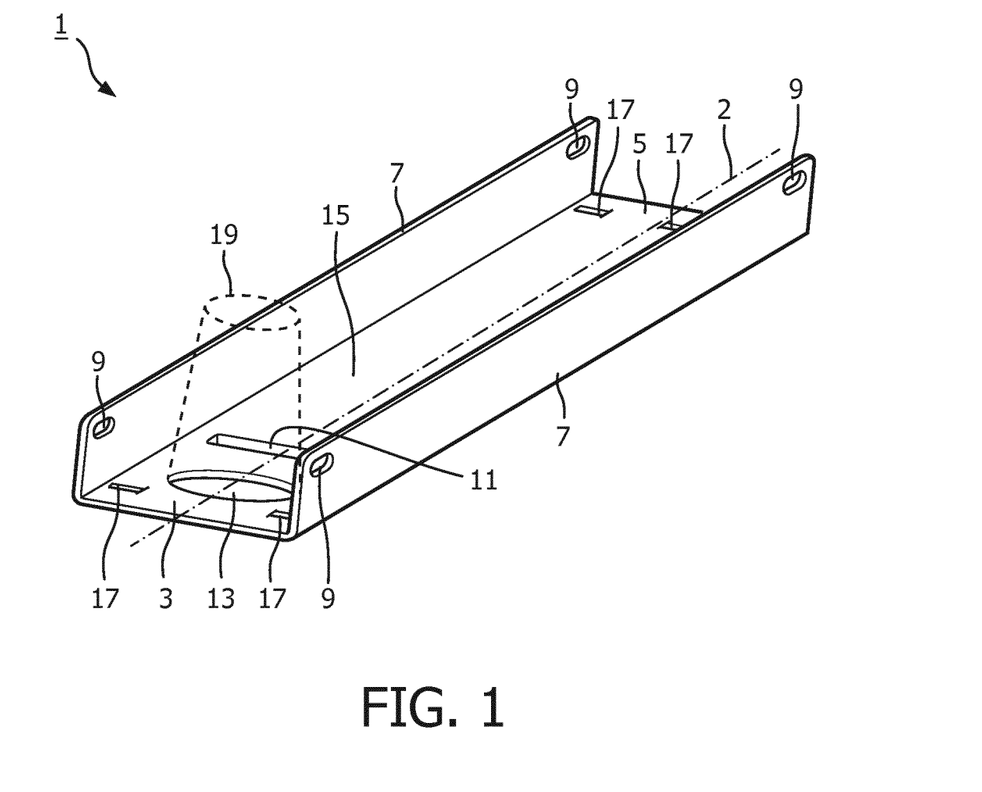
FIG. 1 shows a perspective view of an elongated bracket.

FIG. 1 shows a perspective view of an elongated, electrically conductive bracket 1. The bracket is made, for example, of electrically conductive material, for example metal, electrically conductive plastic or electrically conductive carbon or provided with an electrically conductive coating, and is U-shaped in cross section with respect to an axis 2 having two ascenders 7 mutually connected via a horizontal bar 15. The bracket comprises on respective ascenders 7 at a first 3 and at a second bracket end 5 strip openings 9 through which a strip, for example a metal tie-rap-like strip, can extend, for fixation to a pole, and simultaneously, in case the pole is electrically conductive at its outer surface, for galvanic connection (also referred to as electrical connection or electrically grounded connection). Alternatively, for galvanic connection the bracket may have, for example at the access opening, a tapering protrusion 19 (shown in ghost image) extending away from the horizontal bar along the ascenders. The tapering protrusion may have one or more slits along the tapering direction to render it to be more flexible and fittable to a larger size range. The base of the bracket is provided with a slot 11 and an access opening 13. The bracket further comprises at each bracket end a pair of bracket fixation openings 17 in the horizontal bar 15 for fixation of a base (see FIGS. 2, 5 and 7c).

Figure 2:
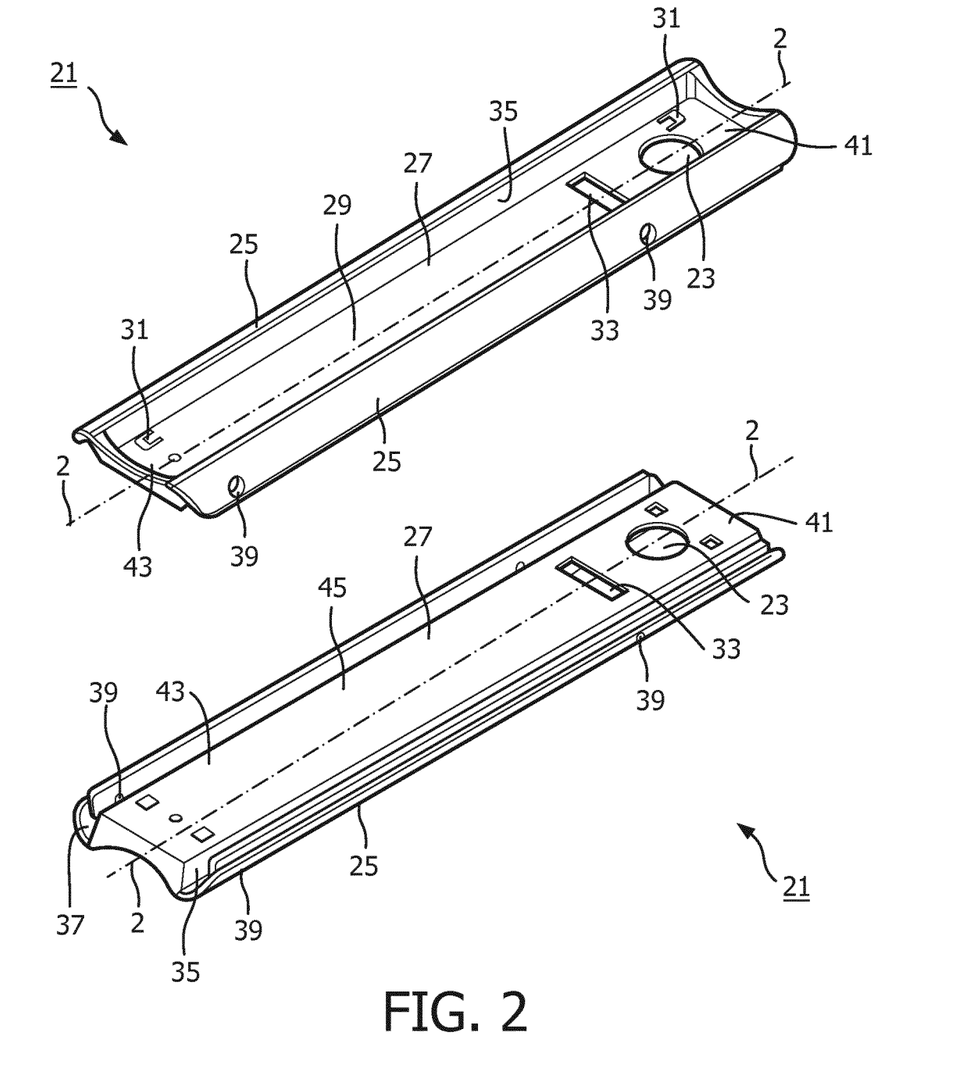
FIG. 2 shows a perspective view of a back-side and a front-side of a base.

FIG. 2 shows a perspective view of a concave, first side 29 or back-side and a second flat side 45 or front-side of an elongated base 21. The base is made from, for example electrically insulating material and/or non-corrosive material, for example synthetic material such as plastic, and has a W-shape in cross section transversal to axis 2 with two curved ascenders 25 mutually connected by horizontal base bar 27 having a concave shape at a base concave, first side 29. The base further at its concave first side has four base protrusions 31 that are arranged to fit and to be accommodated in fixation openings of the bracket (see FIG. 1). The base further has a slotted base opening 33 and a base access opening 23 in the horizontal base bar allowing passing through of electric cabling of being and preferably being provided with a cable gland (not shown). Upon mounting of the base onto the bracket via the base protrusions in the fixation openings of the base, both the access openings in the bracket and the base are aligned and the slot in the bracket and the slotted opening in the base are aligned. The concave side of the base is bordered by a base wall 35, which together with the curved ascenders form an at least partially circumferential groove 37 which is configure to accommodate in assembled configuration an outer edge of a cover. In the figure the groove 37 is in two parts which extend along the axis 2. The curved ascenders are each provided with base fixation openings 39 provided respectively at a first base end 41 and a second base end 43 of the base. The base has a second, flat side 45 on which a carrier will be mounted.

Figure 3:
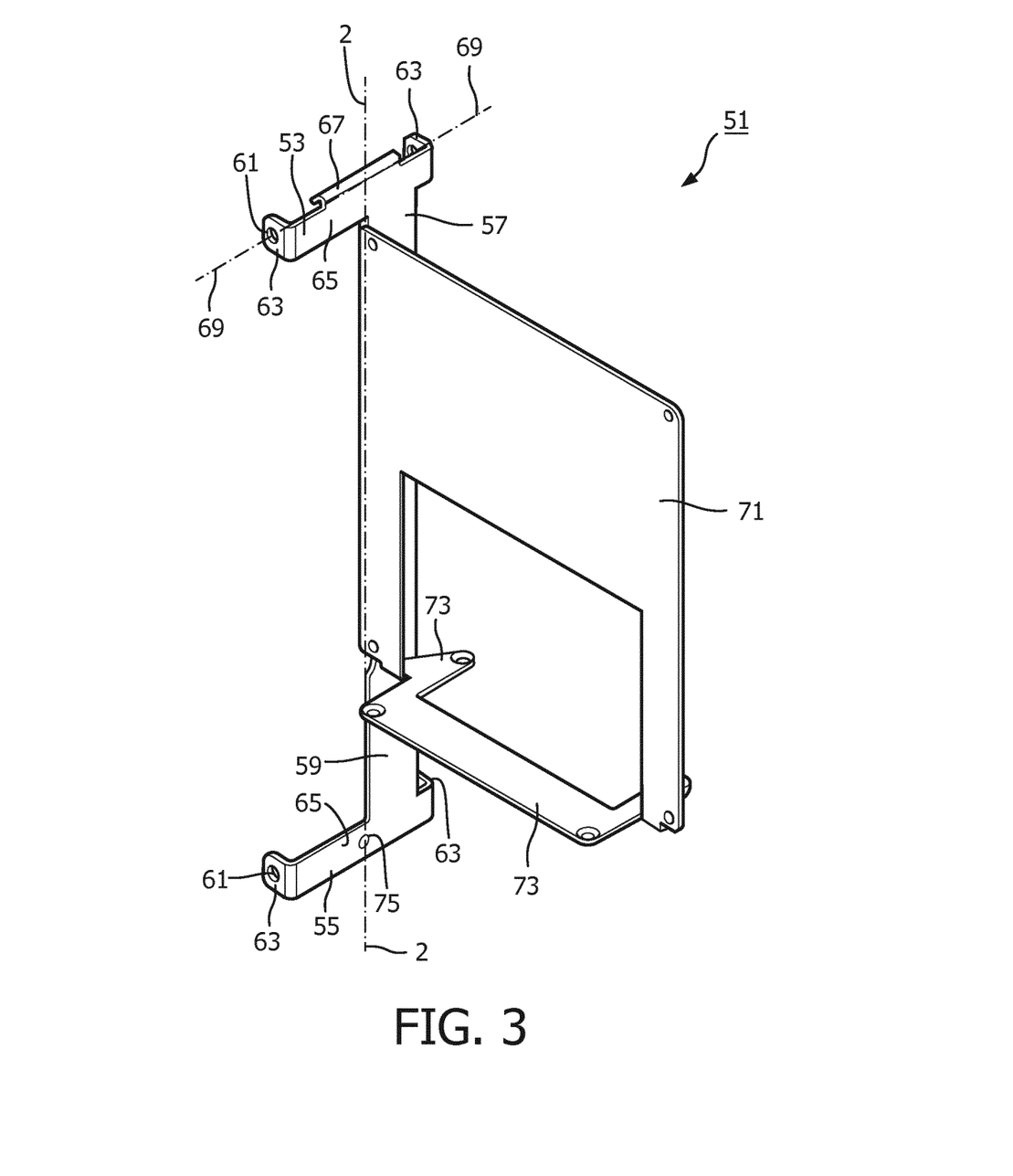
FIG. 3 shows a perspective view of a plate-shaped elongated carrier.

FIG. 3 shows a perspective view of a plate-shaped elongated carrier 51. The carrier is made, for example, of electrically conductive material, for example metal, electrically conductive plastic or electrically conductive carbon or provided with an electrically conductive coating. The carrier is configured to be mounted onto the base and thereto has a first 53 and a second transversely extending strip 55 respectively at a first carrier end 57 and a second carrier end 59. The strips are U-shaped in transverse cross-section and comprise a carrier attachment opening 61 in respective strip ascenders 63 mutually connected via a horizontal strip bar 65 and which in assembled configuration are in alignment with base fixation openings of the base. The first transverse strip 53 has a hook 67 extending transverse to the axis 2, which hook is configured to be accommodated in the slot of the bracket and in the slotted opening of the base and is used as a first carrier fixation means of the carrier to the base. Said hook enables a rotational movement of the carrier over a hook axis 69, said hook axis extending transverse and tangentially to the axis 2 enabling fixation of the carrier to the base via second carrier fixation means 75, for example a screw of bolt opening. The carrier establishes electrical connection with the bracket via said hook. The carrier further has a plate like surface 71 extending along and radially away from the axis 2, said plate optionally being provided with at least one transverse support surface 73, for example to support electric equipment (see FIG. 5).

Figure 4:
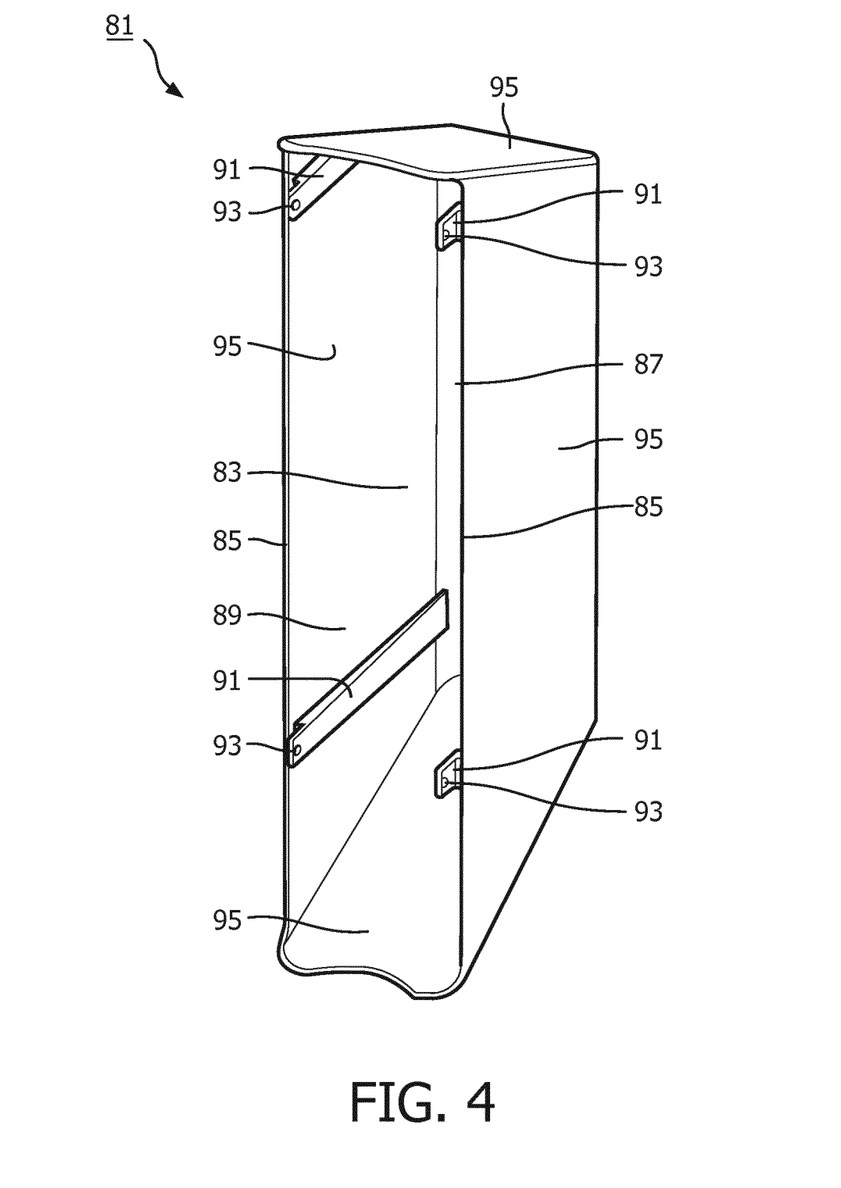
FIG. 4 shows a perspective view of a cover.

FIG. 4 shows a perspective view of a cover 81. The cover has a cover window 83 bordered by a cover edge 85, from where it tapers with four cover walls 95 to a closed end face 87 opposite the cover window. The edge of the cover is configured to fit into, i.e. has a matching shape with, the groove of the base, thus a closed chamber 89 is formed by the cover and the base in which the carrier with electric equipment is (to be) accommodated. At the cover edge the cover has four protruding lips 91, more or less evenly distributed over the cover edge. These lips have lip openings 93 which in assembled configuration of the kit of parts are aligned with the carrier attachment openings (see FIG. 3) and with the base fixation openings (see FIG. 2), so that the base, the carrier and the cover can be mutually firmly fixed/connected with only four screws or bolts, i.e. one screw or bolt per aligned set of lip opening, carrier attachment opening and base fixation opening.

Figure 5:
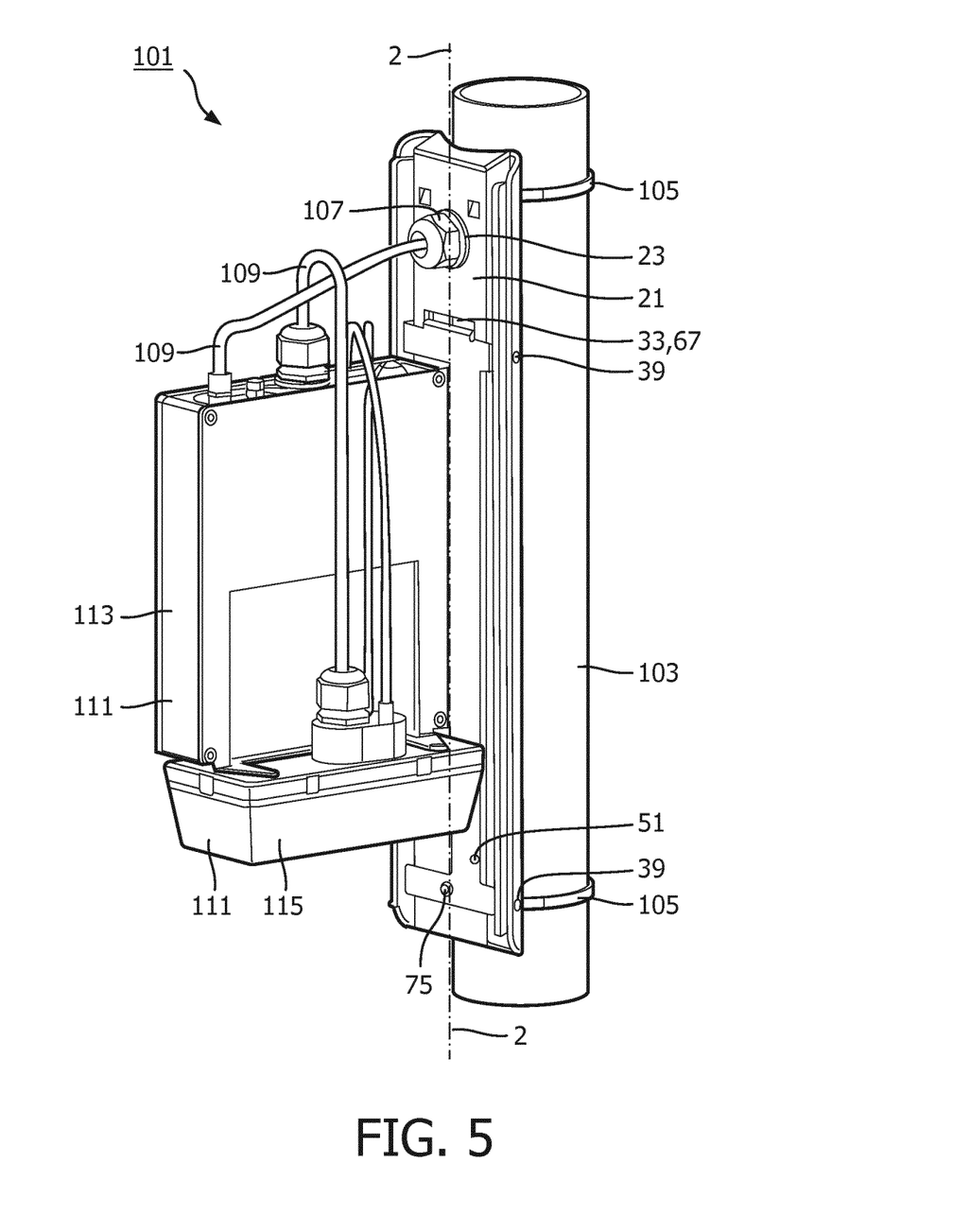
FIG. 5 shows a perspective view of a modular housing without cover.

FIG. 5 shows a perspective view of an assembled modular housing 101 without cover. The modular housing is mounted to a pole 103 via a bracket (not visible) which bracket is fixed to the pole with a pair of strips 105. Onto the bracket a base 21 is mounted and onto the base a carrier 51 is mounted via base fixation means 39. The base and the carrier are mounted to the bracket via slotted features, i.e. slot (not visible), slotted base opening 33 and hook 67 and via second carrier fixation means 75. The base has base access opening 23 which is provided with a cable gland 107 through which cabling 109 extends from the pole to electric equipment 111, for example a Wi-Fi device, mounted onto the carrier and comprising two antennae, one horizontally extending antenna 113 transverse to the length direction of the pole and the axis 2 and one vertical antenna 115 relatively remote from the pole and extending along the axis.

Figure 6:
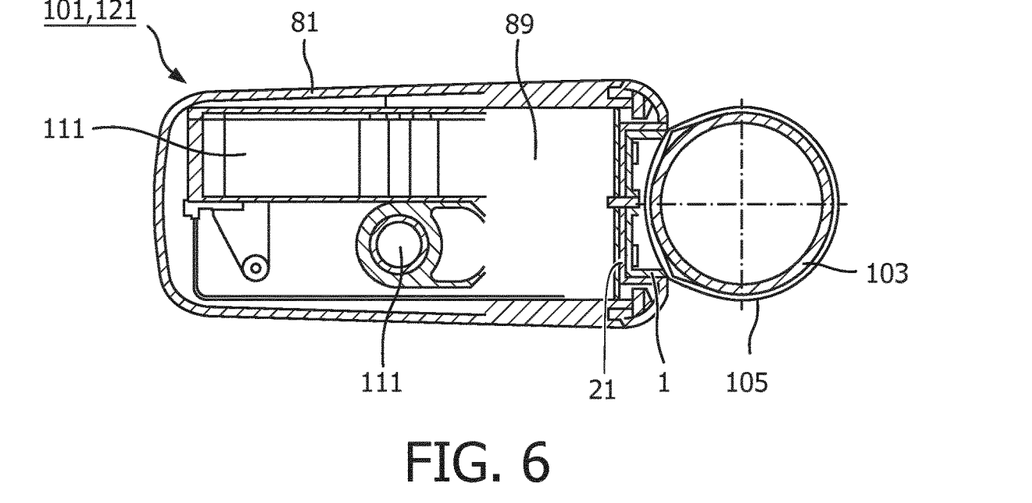
FIG. 6 shows a cross-sectional view of the assembled kit of parts shown in FIG. 5 and provided with cover.
Figure 7A:
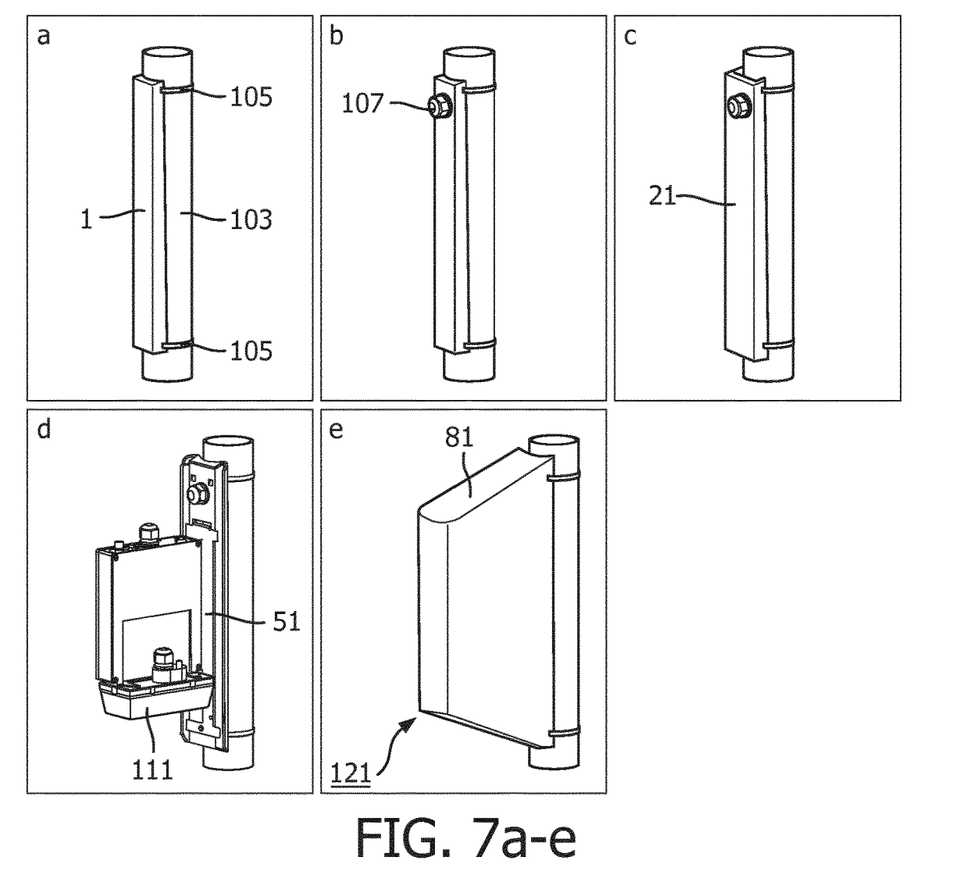

FIG. 6 shows a cross-sectional view transverse to axis 2 of the assembled kit of parts 121 shown in FIG. 5 with the modular housing 101 in mounted position to the hollow pole 103 via the bracket 1 and strips 105 and provided with cover 81. The cover together with the base 21 forms the chamber 89 inside which the electric equipment 111 is accommodated. FIG. 7a-e shows various stages in the installation of the kit of parts onto a pole. FIG. 7a shows the bracket 1 mounted onto the pole 103 via strips 105. FIG. 7b shows the provision of a cable gland 107 onto the bracket. FIG. 7c shows the base 21 mounted onto the bracket and the cable gland extending from said base. FIG. 7d shows the carrier 51 with premounted electric equipment 111 being mounted onto the base (for the sake of clarity the cabling is omitted). FIG. 7e shows the final installation stage of the kit of parts 121 finished off with the cover 81.

The invention claimed is:

1. A kit of parts attachable to a pole, said kit of parts comprising:
    an elongated, electric conductive bracket extending along an axis and attachable to the pole in an electrically grounded connection thereto, and
    a modular housing comprising:
    a base mountable onto the bracket;
    a cover mounted onto the base, the cover and the base enclosing a chamber; and
    a plate-shaped, axially extending, elongated electric conductive carrier provided inside the chamber and in electrically grounded connection to the bracket.

2. The kit of parts of claim 1, wherein in assembled configuration of the modular housing a respective set of a base mounting opening, a cover mounting opening and a carrier mounting opening are aligned for mutual fixation of the base, the cover and the carrier by a single fixing element.

3. The kit of parts of claim 2, wherein the modular housing comprises at least two sets, evenly distributed at the base of the modular housing.

4. The kit of parts of claim 1, wherein the cover has a cover window which is closed by the base and wherein the cover tapers from the cover window to a cover end face opposite to said cover window.

5. The kit of parts of claim 1, wherein the carrier comprises:
    at a first carrier end a first carrier support strip comprising a hook for rotatable seating of the carrier in first bracket attachment means;
    at a second carrier end opposite to the first carrier end, a second carrier support strip comprising a carrier attachment opening, in assembled configuration said carrier attachment opening being aligned with second bracket attachment means;
    each support strips extending on both sides and in transverse direction from the plate-shaped carrier and from the axis.

6. The kit of parts of claim 5, wherein each carrier support strip further comprises at respective opposite strip ends a respective carrier mounting opening, in assembled configuration said carrier mounting opening being aligned with a respective base mounting opening and cover mounting opening.

7. The kit of parts of claim 1, wherein the base has an access opening allowing access of electric cabling from the pole to electric equipment in the chamber, wherein said access opening is provided on an inner portion with a cable gland.

8. The kit of parts of claim 1, wherein the bracket has a tapering protrusion as bracket connection means for an electrically grounded connection to the pole via a press fit with an opening in the pole.

9. The kit of parts of claim 8, wherein said protrusion is hollow and allows access of electric cabling from the pole via the base to electric equipment in the chamber.

10. The kit of parts of claim 1, wherein the bracket has a transversely extending slot as first attachment means and an opening or snap fit feature as second attachment means.

11. The kit of parts of claim 1, wherein electric equipment is accommodated in the chamber and mounted onto the plate-shaped carrier.

12. The kit of parts of claim 11, wherein the cover is permeable for electromagnetic waves and wherein the electric equipment comprises a Wi-Fi device, comprising an axially extending antenna and a transversely extending antenna, wherein the axially extending antenna is positioned more remote from the base than the transversely extending antenna.

13. A street pole provided with the kit of parts according to claim 1.

14. A method for mounting a modular housing, comprising the steps of:
- pre-mounting electric equipment on a plate-shaped, elongated, electric conductive carrier;
- mounting in an electrically grounded connection of an elongated, electric conductive bracket in an axial direction to a street pole along the length of the street pole;
- mounting a base onto the bracket;
- mounting of the plate-shaped, elongated carrier in axial direction onto the base, whereby the carrier is in electrically grounded connection with the bracket;
- mounting of a cover onto the base, thus forming a chamber in which the carrier with electric equipment is accommodated.

* * * * *